United States Patent [19]
Blake et al.

[11] Patent Number: 5,825,038
[45] Date of Patent: Oct. 20, 1998

[54] LARGE AREA UNIFORM ION BEAM FORMATION

[75] Inventors: Julian G. Blake, Beverly Farms; Kenneth H. Purser, Lexington; Adam A. Brailove, Gloucester, all of Mass.; Peter H. Rose, Conway, N.H.; Barbara J. Hughey, Lexington, Mass.

[73] Assignee: Eaton Corporation, Cleveland, Ohio

[21] Appl. No.: 756,656

[22] Filed: Nov. 26, 1996

[51] Int. Cl.$^6$ .................................................. H01J 37/317
[52] U.S. Cl. .................. 250/492.21; 2250/492.3
[58] Field of Search ................ 250/492.21, 492.3, 250/398

[56] References Cited

U.S. PATENT DOCUMENTS

| | | | |
|---|---|---|---|
| 3,954,191 | 5/1976 | Wittkower et al. | 214/17 |
| 4,228,358 | 10/1980 | Ryding | 250/457 |
| 4,229,655 | 10/1980 | Ryding | 250/400 |
| 4,234,797 | 11/1980 | Ryding | 250/492 |
| 4,258,266 | 3/1981 | Robinson et al. | 250/492 |
| 4,346,301 | 8/1982 | Robinson et al. | 250/492.2 |
| 4,433,951 | 2/1984 | Koch et al. | 414/217 |
| 4,550,239 | 10/1985 | Uehara et al. | 219/121 |
| 4,553,069 | 11/1985 | Purser | 315/111.81 |
| 4,568,234 | 2/1986 | Lee et al. | 414/404 |
| 4,705,951 | 11/1987 | Layman et al. | 250/442.1 |
| 4,745,287 | 5/1988 | Turner | 250/492.2 |
| 4,836,733 | 6/1989 | Hertel et al. | 414/225 |
| 4,847,504 | 7/1989 | Aitken | 250/492.2 |
| 4,859,908 | 8/1989 | Yoshida et al. | 315/111.81 |
| 4,899,059 | 2/1990 | Freytsis et al. | 250/492.2 |
| 4,911,103 | 3/1990 | Davis et al. | 118/725 |
| 4,917,556 | 4/1990 | Stark et al. | 414/217 |
| 4,952,843 | 8/1990 | Brown et al. | 315/111.81 |
| 5,229,615 | 7/1993 | Brune et al. | 250/492.2 |
| 5,308,989 | 5/1994 | Brubaker | 250/441.11 |
| 5,404,894 | 4/1995 | Shiraiwa | 134/66 |
| 5,478,195 | 12/1995 | Usami | 414/786 |
| 5,523,652 | 6/1996 | Sferlazzo et al. | 315/111.41 |

FOREIGN PATENT DOCUMENTS

| | | |
|---|---|---|
| 0 339 951 A | 11/1989 | WIPO . |
| 0 428 319 A | 5/1991 | WIPO . |

OTHER PUBLICATIONS

Ryan, T. et al.(Jul., 1990), "Characterization of A Large Linear Ion Source", *Journal of Vacuum Science and Technology:* Part AΔ 8 No. 4 3284–3288.

Primary Examiner—Jack I. Berman
Attorney, Agent, or Firm—Thomas J. Engellenner; Anthony A. Laurentano; Lahive & Cockfield, LLP

[57] ABSTRACT

A high throughput ion implantation system that rapidly and efficiently processes large quantities of flat panel displays. The ion implantation system has an ion chamber generating a stream of ions, a plasma electrode having an elongated slot with a high aspect ratio for shaping the stream of ions into a ribbon beam, and an electrode assembly for directing the stream of ions towards a workpiece. The plasma electrode can include a split extraction system having a plurality of elongated slots oriented substantially parallel to each other. The ion implantation system can also have a diffusing system for homogenizing the ion stream. Various exemplary diffusing systems include an apertured plate having an array of openings, diffusing magnets, diffusing electrodes, and dithering magnets.

55 Claims, 14 Drawing Sheets

LARGE AREA UNIFORM ION BEAM FORMATION

REFERENCE TO RELATED APPLICATIONS

The current application is a continuation-in-part of and incorporates by reference the commonly-owned, co-pending U.S. patent application Ser. No. 08/601,983, for ION IMPLANTATION SYSTEM FOR FLAT PANEL DISPLAYS, filed on Feb. 16, 1996.

This application is also related to and incorporates by reference the following commonly assigned United States Patent Applications:

Ser. No. 08/756,972, for METHODS AND APPARATUS FOR COOLING WORKPIECES (Attorney Docket No. ETE-002), filed the same day herewith;

Ser. No. 08/757,726, for CONTROL MECHANISMS FOR DOSIMETRY CONTROL IN ION IMPLANTATION SYSTEMS (Attorney Docket No. ETE-003), filed the same day herewith;

Ser. No. 08/756,970, for METHODS AND APPARATUS FOR CONTROLLING HYDROGEN DOSAGE DURING ION IMPLANTATION (Attorney Docket No. ETE-006), filed the same day herewith;

Ser. No. 08/753,514, for ION SOURCE SHIELDS (Attorney Docket No. ETE-008), filed the same day herewith;

Ser. No. 08/756,133, for ION IMPLANTATION SYSTEM FOR IMPLANTING WORKPIECES (Attorney Docket No. ETE-010), filed the same day herewith; and Ser. No. 08/756,372, for LOADLOCK ASSEMBLY FOR ION IMPLANTATION (Attorney Docket No. ETE-011), filed the same day herewith.

BACKGROUND OF THE INVENTION

The present invention relates to ion implantation systems for large area workpieces, and more particularly, to ion implantation systems for forming large area ion beams for implanting flat panel displays.

Ion implantation has become a standard, commercially accepted technique for introducing conductivity-altering dopants into a workpiece, such as a semiconductor wafer or glass substrate, in a controlled and rapid manner. Conventional ion implantation systems include an ion source that ionizes a desired dopant element which is then accelerated to form an ion beam of prescribed energy. This beam is directed at the surface of the workpiece. Typically, the energetic ions of the ion beam penetrate into the bulk of the workpiece and are embedded into the crystalline lattice of the material to form a region of desired conductivity. This ion implantation process is typically performed in a high vacuum, gas-tight process chamber which encases a wafer handling assembly and the ion source. This high vacuum environment prevents dispersion of the ion beam by collisions with gas molecules and also minimizes the risk of contamination of the workpiece by airborne particulates.

The process chamber is typically coupled via a valve assembly with an automated wafer handling and processing end station. The end station can include an intermediate chamber or pressure lock which can be pumped down from atmospheric pressure by a vacuum pumping system. This chamber preferably communicates at one end with an end effector which transfers the workpieces from one or more cassettes to the intermediate chamber. Once a workpiece has been loaded into the intermediate chamber by the end effector, the chamber is evacuated via the pump to a high vacuum condition compatible with the process chamber. A valve at the downstream end of the intermediate chamber then opens and the wafer handling assembly mounted within the process chamber removes the workpiece from the chamber. After the workpiece is positioned in the chamber, it can be implanted by the ion source.

The typical ion beam path in prior art ion implantation systems include an ion source, electrodes, an analyzing magnet arrangement, an optical resolving element, and a wafer processing system. The electrodes extract and accelerate ions generated in the ion source to produce a beam directed towards the analyzing magnet arrangement. The analyzing magnet arrangement sorts the ions in the ion beam according to their charge-to-mass ratio, and the wafer processing system adjusts the position of the workpiece along two axes relative to the ion beam path.

In particular, as each individual ion leaves the electrodes and enters the analyzing magnets, its line of flight is bent into a path having a radius proportional to the square root of the mass of the ion. A resolving slit in the analyzing magnet arrangement, in conjunction with the optical resolving element, focus ions having a selected charge-to-mass ratio so that the ions are directed towards the workpiece. Ions not having the selected charge-to-mass ratio are focused either to the left or to the right of the resolving slit and are selected out of the final ion beam striking the target workpiece.

In the earlier ion implantation machines, the ion source aperture was typically a small hole approximating a point source. To achieve higher ion beam currents, the size of the circular plasma aperture was increased, but it was soon discovered that there was a limit to the increase in size of a circular aperture which would give an ion beam of acceptable quality. Beam instability due to an unstable plasma meniscus resulted when both vertical and horizontal dimensions of the source aperture were simultaneously increased. However, it was found that, by lengthening the circular hole into a rectangular slit, higher beam currents without beam instability could be obtained. The rectangular slit was oriented perpendicular to the disbursive plane of the analyzing magnet, tracking the parallel developments in obtaining higher currents in isotope separators that utilized ion source exit slits with the same orientation to the pole piece of the analyzing magnet.

To achieve higher and higher ion beam currents, the length of the ion exit aperture can be increased. Until, in current practice, apertures capable of maintaining a stable plasma meniscus have been formed with a width in the range of 1–3 mm. Prior art techniques that attempted further increases in the size of the resolving have met with failure because of the beam blow-up phenomenon caused by use of the analyzing magnet in conjunction with larger slits. In addition, earlier systems that employ analyzing magnets in conjunction with larger slits are required to either: (1) dramatically increases the size, expense, and power requirements of the analyzing magnet arrangement, or (2) space the ion source further away from the analyzing magnets. Each of these approaches can lead to further undesirable side effects.

For example, as the ion beam source is moved further away, some of the gain in additional beam current from a longer ion exit slit is lost as a greater portion of the ion beam is neutralized in the longer line of flight region between the source and the analyzing magnet. To counteract this, larger and more expensive vacuum pumps are required to avoid conversion of ions into neutralized species which cannot be analyzed. Thus, moving the ion source further from the analyzing magnet produces corresponding increases in overall size and complexity of the machine which directly translate into higher costs in manufacturing an installation.

U.S. Pat. No. 4,847,504, issued to Atkin, discloses an ion implantation system having a selected analyzing magnet geometry for increasing the ion current source. According to Aitken, higher ion beam currents can be obtained with rectangularly shaped ion exit apertures that are aligned in a predetermined orientation with respect to the analyzing magnets. Aitken's system employed an ion exit slit substantially wider than 3 mm, e.g. up to 5 mm or 6 mm.

Robinson et al., U.S. Pat. No. 4,258,266, also discloses an ion implantation system having a ribbon shaped ion beam that is directed at a wafer wheel. The ion implantation system includes an ion source having a magnetic analyzer therein. The ribbon shaped ion beam of the Robinson et al. system is used to produce an ion beam using a length up to 50 times higher than the width.

Today's burgeoning semiconductor and implantation technology has found widespread acceptance in the marketplace. With this acceptance has come demands for generating large quantities of implanted articles at competitive prices. A common goal of most modem implantation systems is to satisfy these demands by increasing the throughput of the system. Presently existing systems, however, are not well suited to meet these manufacturing and cost demands.

Hence, there still exists a need in the art for improved ion implantation systems that exhibit high throughput for large area flat panel workpieces. An ion implantation system capable of rapidly producing high volumes of flat panel displays represents a major improvement in the art.

SUMMARY OF THE INVENTION

The ion implantation system of the present invention achieves increased throughput by forming a ribbon beam from an electrode having a high aspect ratio. In particular, the ion implantation system has an ion chamber containing a plasma, and a plasma electrode engaging an opening in wall of the ion chamber. The plasma electrode is fashioned as an elongated slot having a length at least fifty times longer than the width of the slot. The elongated plasma electrode shapes the stream of ions exiting the ion chamber. Additionally, the ion implantation system includes an electrode assembly downstream of the plasma electrode. The electrode assembly directs the stream of ions exiting the ion chamber through the plasma electrode towards the workpiece. The stream of ions directed towards the workpiece form a ribbon beam.

The term "ribbon beam" as used herein includes an elongated ion beam having a length that extends along an axis of elongation and having a width that extends along a second path transverse to the elongation axis. Ribbon beams prove effective in implanting large area workpieces because they can reduce the number of passes of the workpiece through the ion beam required to obtain a pre-selected dosage. For instance, prior art techniques required that the ion beam be scanned in two orthogonal directions over the workpiece to completely cover the workpiece. In comparison, when a ribbon beam has a length that exceeds at least one dimension of the workpiece, only one scan of the workpiece through the ribbon beam is required to completely cover the workpiece. The term high aspect ratio is used herein to describe ribbon beams having an aspect ratio of at least 50:1. Ribbon beams formed from electrodes having even higher aspect ratios of 100:1 may be produced using the ion implantation system disclosed herein. These ribbon beams prove useful in implanting larger workpieces, such as workpieces having dimensions exceeding 550 mm by 650 mm.

According to one aspect of the invention, the ion implantation system uses a non-mass analyzed ribbon beam. It has been discovered that the ribbon beams required to efficiently treat large area workpieces can be formed without beam blow-up by eliminating the analyzing magnets typically used in forming ion beams.

Further features of the invention provide for large ranges in current density and power in the ion beam. Techniques known in the art are not able to produce a ribbon beam as disclosed herein with the same ranges in current density and power. The invention accomplishes these objectives by providing for two or more slots in the plasma electrode oriented substantially parallel to each other, with each slot having aspect ratios that exceed 50:1. Accordingly, these slots form a split extraction system that produces overlapping ribbon beams at the surface of the workpiece, i.e. a cumulative ribbon beam.

The cumulative ribbon beam produced by the split extraction system has a current density ranging from 0.02 to 100 microamps per square centimeter. In addition, the cumulative ribbon beam has a power that ranges from 1 to 100 kilowatts. The cumulative ribbon beam can be further characterized by its size at the workpieces, that varies from 25 centimeters to 1000 centimeters in length and that varies from 1 millimeter to 250 millimeters in width. Preferably, the width of the cumulative ribbon beam varies from 10–15 centimeters at the surface of the workpiece.

It has been further discovered that the ribbon beams generated by the system disclosed herein are also highly collimated. The highly collimated ion beams are particularly susceptible to disturbances in the path of the ion beam. Disturbances, such as stray energy fields, curves in the plasma meniscus, or particle contamination, cause non-uniformities to arise in the current density of the ribbon beam at the surface of the workpiece. For instance, a particle contaminating the edge of an electrode might cause an ion stream to alter its original path from the ion source towards the workpiece. The altered path of the ion stream can then cause an increase in current density at one point on the workpiece and a decrease in current density at another point on the workpiece. These slight changes when propagated through the implantation system give rise to non-uniformities. To overcome these problems the invention can further include a diffusing system.

The diffusing system homogenizes the ion stream forming the ribbon beam. By homogenizing the ion stream the overall ribbon beam obtains increased uniformity of current density along at least one axis of the ribbon beam. For example, if the ion stream is highly collimated, then a slight disturbance can affect the uniformity of the ribbon beam. In comparison, when the ion stream forming the ribbon beam is homogenized, then the ion stream intentionally includes ions moving along scattered, i.e. non-parallel, paths from the ion source towards the workpiece. These intentionally modified ion paths reduce the effects caused by disturbances in the beam path, thereby reducing any non-uniformities arising at the workpiece.

The diffusing element can include an apertured plate having an array of openings and placed in the path of the stream of ions forming the ribbon beam. The ion stream is homogenized as it passes through the array of openings in the apertured plate. Typically, the apertured plate is mounted within the opening in the ion chamber. Under these circumstances, the apertured plate is fashioned to be a plasma electrode that has an array of openings for homogenizing the ion stream.

In accordance with another aspect of the invention, the apertured plate can include a plurality of arrays, each array being formed of a group of openings. A geometry associated with these arrays that increases the uniformity of the ion beam is governed by the expression, L<gNlΘ
where L=the distance between openings in the apertured plate, g=a constant in the range of 0 to 1,
N=the number of arrays in the apertured plate,
l=the distance between the apertured plate and the workpiece, and
Θ=the angular width of the stream of ions exiting at least one opening in the apertured plate.

Other features that enhance the homogenizing action of the apertured plate have been discovered. According to a further aspect of the invention, the openings included in the apertured plate are preferably oriented in an array that extends along an axis substantially parallel to the length of the elongated slot. Further features of the invention provide for an array of openings having a plurality of elliptical or oval shaped openings, each ellipse or oval being oriented substantially parallel to each other. The elliptically shaped openings are separated by a distance, D, in accord with the expression D=kL, where L is the length of each elliptically shaped opening along the axis and where k is a constant in the range of ½ to ¾. In other cases, the array of openings in the apertured plate may be circularly shaped and oriented in a plurality of staggered lines.

Additional aspects of the invention provide for alternative diffusing systems capable of homogenizing the ions stream forming the ribbon beam. For instance, the diffusing system can include a magnet generating an oscillating magnetic field proximal to the path of the stream of ions; the diffusing system can include an electrode generating an oscillating electric field near the stream of ions; or the diffusing system can include a dithering magnet coupled with the ion chamber for causing the plasma to oscillate.

BRIEF DESCRIPTION OF THE DRAWINGS

The foregoing and other objects, features and advantages of the invention will be apparent from the following description and apparent from the accompanying drawings, in which like reference characters refer to the same parts throughout the different views. The drawings illustrate principles of the invention and, although not to scale, show relative dimensions.

DESCRIPTION OF ILLUSTRATED EMBODIMENTS

Figure 1:
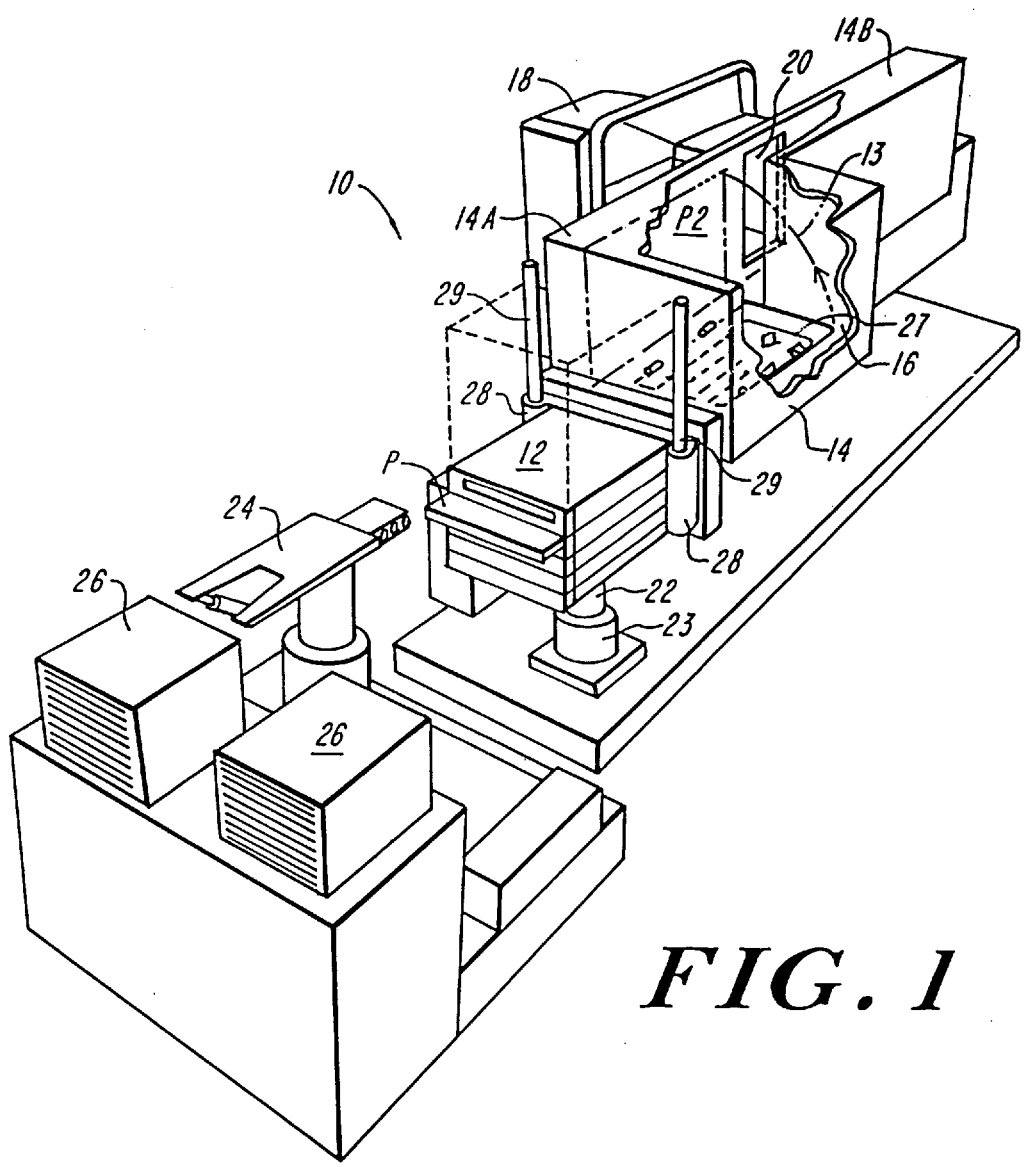
FIG. 1 is a perspective view of the ion implantation system according to the present invention.

The ion implantation system 10 of the present invention includes a pair of panel cassettes 26, an end effector 24, a loadlock assembly 12, a housing 14 which defines a process chamber 16, and an ion source 18, which communicates with the process chamber 16 through beam aperture 20. An end effector 24 transfers panels P stacked in cassette 26 to the loadlock assembly 12.

The illustrated end effector 24 is coupled to convention drive and control mechanisms which provide power to the end effector and which control the rate and sequence of panel movement. The panel cassettes 26 are of conventional structure and provide a convenient storage facility for the panels.

The loadlock assembly 12 is also coupled to a linear bearing system and a linear drive system, which provide the desired vertical movement of the loadlock assembly 12 as well place and maintain hold the loadlock assembly 12 in sealing contact with the process chamber housing 14, as described in further detail below. The linear drive system includes a lead screw 22 and a motor assembly 23. The motor assembly 23 drives the lead screw 22 which in turn positions the loadlock assembly 12 at a selected vertical position, as indicated in dashed lines. The linear bearing system includes a pair of stationary linear bearings 28 mounted to the loadlock assembly which slide along circular shafts 29.

A translation assembly is preferably mounted within the process chamber 16. The translation assembly includes a pickup arm 27 which is similar in design and function to the end effector 24. The pickup arm 27 handles the panel P during processing. When the pickup arm 27 initially removes the panel P from the loadlock assembly 12, it is oriented in a substantially horizontal position P1. The pickup arm then vertically flips the panel, as denoted by arrow 13, into a substantially vertical position P2. The translation assembly then moves the panel in a scanning direction, from left to right in the illustrated embodiment, across the path of an ion beam emerging from aperture 20, and which is generated by the ion source 18.

Figure 2:
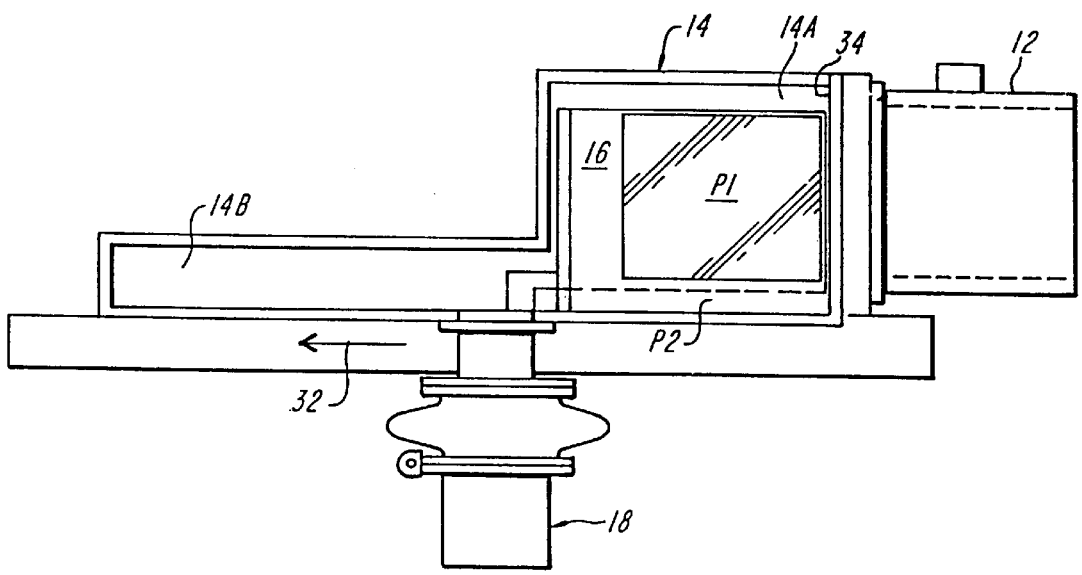
FIG. 2 is a top view of a portion of the ion implantation system of FIG. 1.

With reference to FIGS. 1 and 2, the process chamber housing 14 includes a front housing portion 14A and a narrower elongated portion 14B. The front housing portion is sized to accommodate the removal of the panel P from the loadlock assembly 12 in the horizontal position. The panel is then moved from the original horizontal position P1 to the vertical position P2 prior to movement along the scanning direction, indicated in FIG. 2 by arrow 32. The housing portion 14B has an axial dimension along the scanning direction that allows the panel to pass completely by the ribbon beam generated by the ion source 18. The relatively narrow width of the chamber portion 14B preferably allows the panel to move there along only when disposed in the vertical position P2 to reduce the total volume of the process chamber 16. This reduction in chamber volume allows faster evacuation of the process chamber. Reducing the time necessary to evacuate the chamber serves to increase the total throughput of the implantation system 10.

The illustrated loadlock assembly 12 is preferably sealingly coupled to the front chamber wall 34 of the chamber housing 14. The loadlock assembly 12 maintains a relatively pressure-tight and fluid-tight seal with the chamber wall 34 during the vertical movement of the loadlock assembly 12. This sliding seal tight arrangement is described in further detail below.

Referring again to FIG. 1, the ion source 18 forms a ribbon beam having a long dimension that exceeds at least the smaller dimension of the panel being processed. More specifically, the ion source generates a ribbon beam whose length exceeds the panel's narrow dimension. The use of a ribbon beam in conjunction with the ion implantation system 10 of the present invention provides for several advantages, including (1) the ability to process panel sizes of different dimensions with the same system; (2) achieving a uniform implant dosage by controlling the scan velocity of the panel in response to the sampled the current of the ion beam; (3) the size of the ion source can be reduced and is thus less expensive and easier to service; and (4) the ion source can continuously be operated. The continuous operation of the ion source increases the efficiency of the system 10 since it produces a more uniform implant by eliminating problems associated with turning the ion source off and on, as in prior approaches. These problems typically include beam current density transients which occur upon start-up operation of the source.

Figure 3:
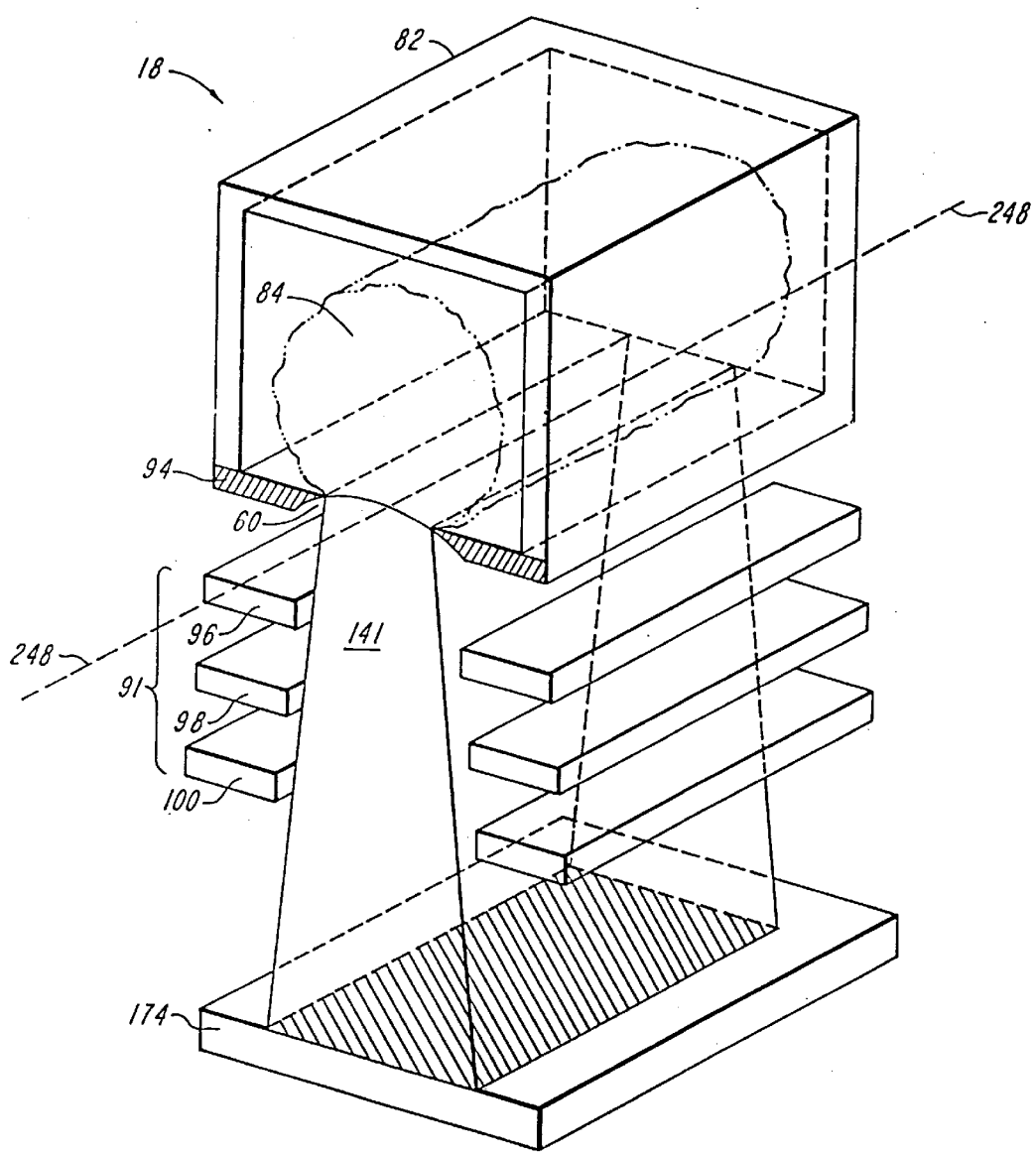
FIG. 3 is a perspective view of the ion source shown in FIG. 1.

FIG. 3 illustrates a perspective view of the ion source 18, including an ion chamber 82 and an electrode assembly 91. The ion chamber 82 forms a closed container for holding a plasma 84. The ion chamber has an opening 60 at one end of the ion chamber. The opening allows ions to exit the ion chamber 82 and form an ion stream 141. The ion stream 141 is directed towards a workpiece 174 by the electrode assembly 91.

The opening 60, in the ion chamber, is covered by a plasma electrode 94. The plasma electrode is adapted for engaging the opening 60 and the plasma electrode has an aperture formed for shaping the stream of ions exiting the ion chamber. In particular, the plasma electrode has a slot elongated along an axis 248. The elongated slot has a high aspect ratio for shaping the stream of ions exiting the ion chamber 82 into a ribbon beam.

The elongated slot has a high aspect ratio, that is the length of the slot along axis 248 greatly exceeds the width of the slot along a transverse axis. The high aspect ratio of the slot provides an ion beam capable of treating a workpiece positioned below the ion beam with high current densities and high energy levels. Generally, the length of the slot is at least fifty times the width of the slot. Preferably, the length of the slot along axis 248 is at least one hundred times the width of the slot along a transverse axis. This very high aspect ratio, e.g. 100:1, forms a ribbon beam particularly applicable to the implantation of large area workpieces.

In ion implantation system 10 the length of the slot is determined as a function of the width of the workpiece. The length of the elongated slot in the plasma electrode 94 must be longer than the width of the workpiece to eliminate the need for a two directional workpiece scanning system. Furthermore, the aspect ratio between the width and the length of the plasma electrode preferably exceeds 50:1 to achieve an acceptable level of control over the ion flow from the ion source.

For instance, if the slot in the plasma aperture is elongated and the slot remains wide then the ions flow through the slot in an uncontrolled manner. In comparison, when the slot is long and the slot remains narrow, the ions flow through the slot in a controlled manner. Slots having a high aspect ratio reduce gas flow from the source and allow the source to operated at high plasma densities for a given dose. This allows the source to operated over a wider range of current densities. Accordingly slots having aspect ratios exceeding 50:1, and preferably exceeding 100:1, are most suited for implanting large areas workpieces.

The electrode assembly 91, placed downstream of the plasma electrode 94, includes an extraction electrode 96, a suppression electrode 98 and a ground electrode 100. The electrode assembly directs and accelerates the ions in the ion stream 141 towards the workpiece. Typically, a set of variable voltage supplies (not shown) regulate the voltages between the electrodes 94, 96, 98, and 100. The set of variable voltage supplies are adjusted so that the plasma electrode, the extraction electrode, and the suppression electrode are at a selected voltage relative to the ground electrode. For instance, the suppression electrode 98 is adjusted to be minus three kilovolts, the extraction electrode is adjusted to be at 90 kilovolts, and the plasma electrode is typically adjusted to be at 95 kilovolts. The voltages can be adjusted to make adjustments to the energy and focus of the ion stream 141.

Figure 4:
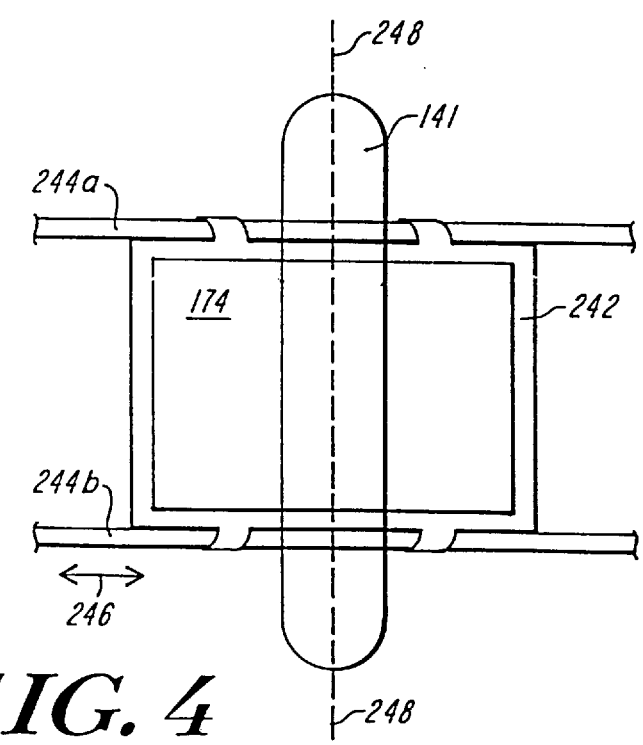
FIG. 4 is an overhead cross sectional view of a ribbon beam produced using the ion source of FIG. 3.

FIG. 4 illustrates an overhead cross sectional view of the ribbon beam 141 at the surface of the workpiece 174. The workpiece is supported by a workpiece platform. The workpiece platform, as shown, includes two substantially parallel rails 244A and 244B and a table 242 mounted to the rails 244A and 244B. The table 242 can be mounted to the rails using slidable mounts known in the art, such as a linear bearing or an air bearing. The table 242 is mounted in a fashion that allows the table to move along axis 246 and that allows a motor (not shown) to drive the table 242 along the direction of axis 246.

Preferably, the ion source 18 generates a ribbon beam 141 having a cross sectional area as shown in FIG. 4. The ribbon beam is an ion beam elongated along one axis. The axis of elongation of the ribbon beam is labeled as axis 248 and is shown to be substantially perpendicular to the direction of movement of the workpiece 174 along axis 246.

The length of the ribbon beam 141 along axis 248 exceeds at least the narrower dimension of the workpiece 174. This distinction advantageously allows a workpiece traveling along axis 246 and approximately centered in the ribbon beam to be completely exposed to the ion stream during one pass through the ribbon beam. Thus, the ribbon beam eliminates the need for a complex two directional scanning system that moves the workpiece along a scanning direction and an orthogonal direction.

Figure 5:
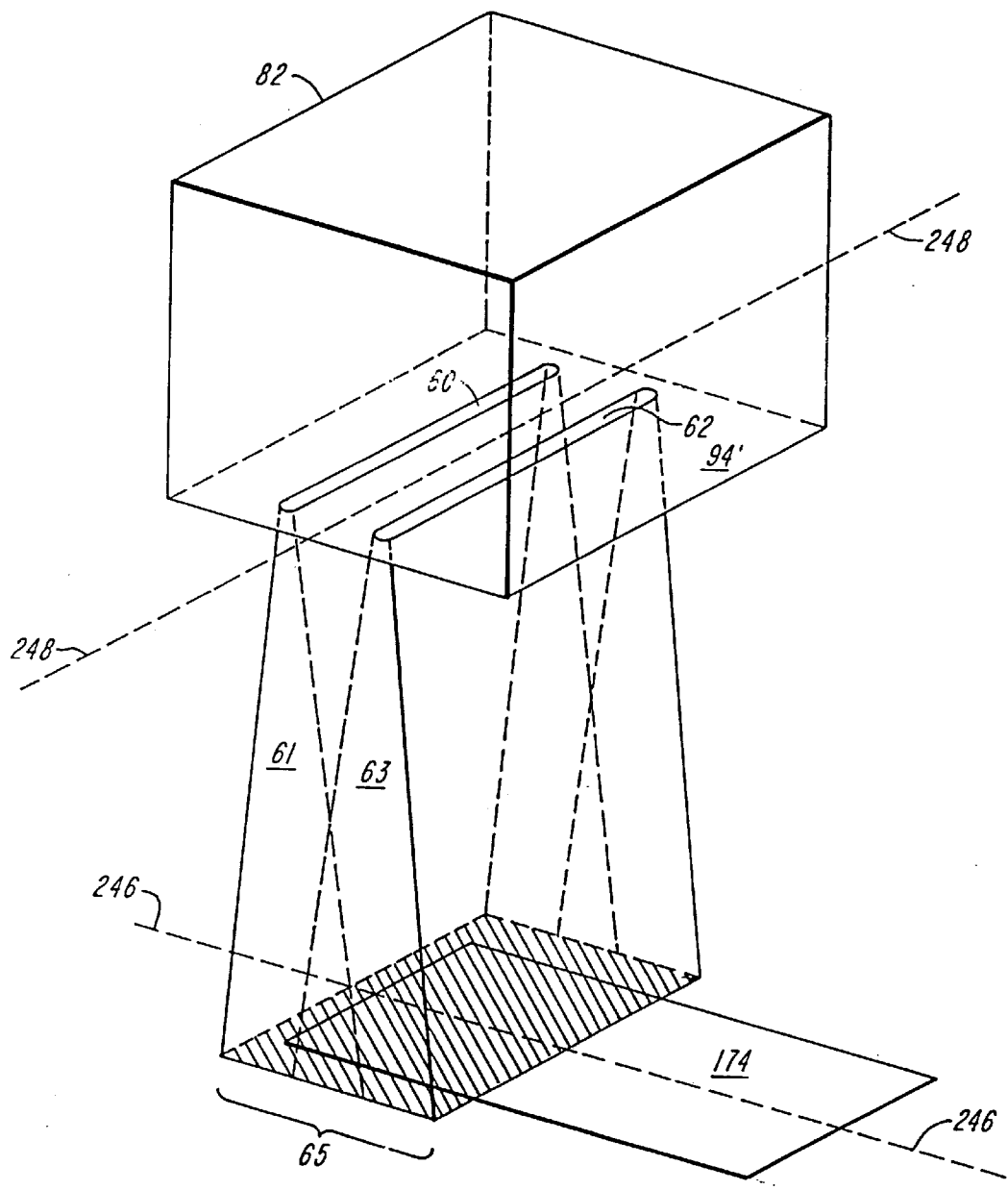
FIG. 5 is a perspective view of a plasma electrode having two slots and a ribbon beam.

FIG. 5 is a perspective view of a plasma electrode 94' that is adapted for engaging the opening in the ion chamber 82. The plasma electrode 94' has a first slot 60 and a second slot 62, both of which are elongated along an axis substantially parallel to axis 248. A stream of ions from the ion chamber 82 passes through both the first slot 60 and the second slot 62 to treat the workpiece 174.

A first stream of ions passing through the first slot 60 forms an ion beam 61 in the shape of a ribbon beam. A second stream of ions passing the second slot 62 forms a second ion beam 63 in the shape of a ribbon beam. As a result of the elongated shape of slots 60 and 62, the ion beams are formed into the shape of ribbon beams 61 and 63 extending along axis 248.

Preferably, slots 60 and 62 are separated by a distance that causes the ribbon beams 61 and 63 to minimally overlap at the surface of the workpiece 174. The first and second ribbon beams 61, 63 form a cumulative ribbon beam 65. The cumulative ribbon beam 65 can be formed of two or more ribbon beams.

The cumulative ribbon beam 65 has a greater range in current density and energy than a single individual ribbon beam typically achieves. For example, the cumulative ribbon beam 65 can have a current density in the range of 0.02 to 100 $\mu$Amps/cm$^2$. The energy of the ions in the cumulative ribbon beam can be varied in the range of 1–100 kiloelectron volts (keV).

Moreover, the use of a plurality of slots 60, 62 in the plasma electrode 94' provides for greater variability in the size of the ribbon beam 65 at the surface of the workpiece 174.

For instance, a single ribbon beam may be limited in the width of the ribbon beam achievable along axis 246. In comparison, a cumulative ribbon beam formed of multiple ribbon beams aligned parallel to axis 248 can theoretically achieve a cumulative ribbon beam of infinite width extending along axis 246. The increased width of the ribbon beam advantageously provides for an increased rate of doping per unit time.

The cumulative ribbon beam 65 can have a length that varies from 25 to 1000 cm. at the surface of the workpiece. The cumulative ribbon beam can also have a width that varies from 1 mm. to 250 mm. at the surface of the workpiece. Preferably, the width of the cumulative ribbon beam along axis 246 varies between 10 and 30 cm. at the surface of the workpiece. The preferred width of the ribbon beam, between 10 and 30 cm., provides for an ion stream that efficiently and effectively doses the workpiece without causing the workpiece to overheat or be subjected to non-uniformities in current density.

Figure 6A:
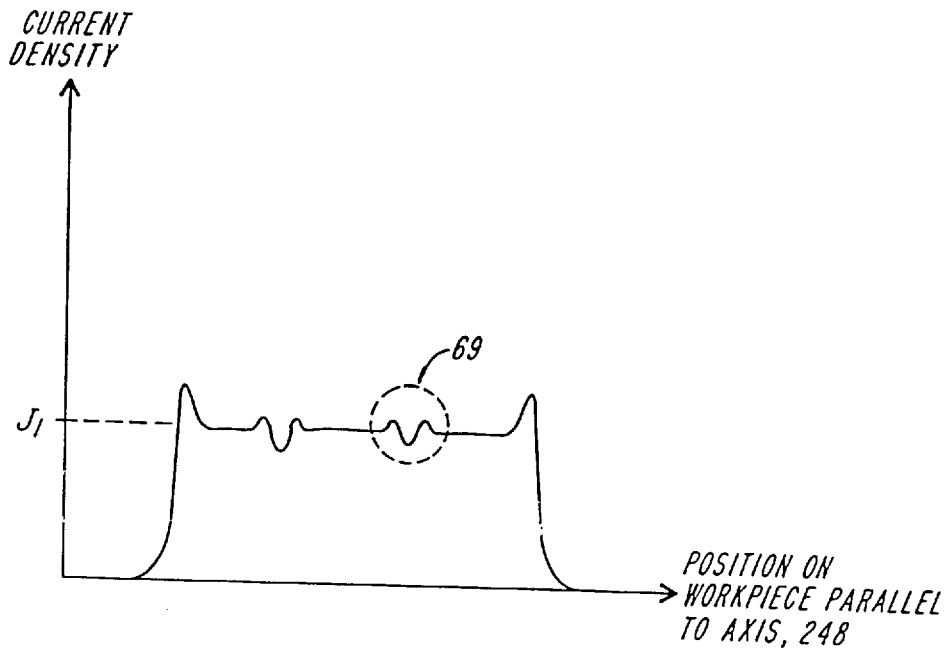
FIGS. 6A and 6B illustrate non-uniformities that can arise in the system of FIG. 1.
Figure 6B:
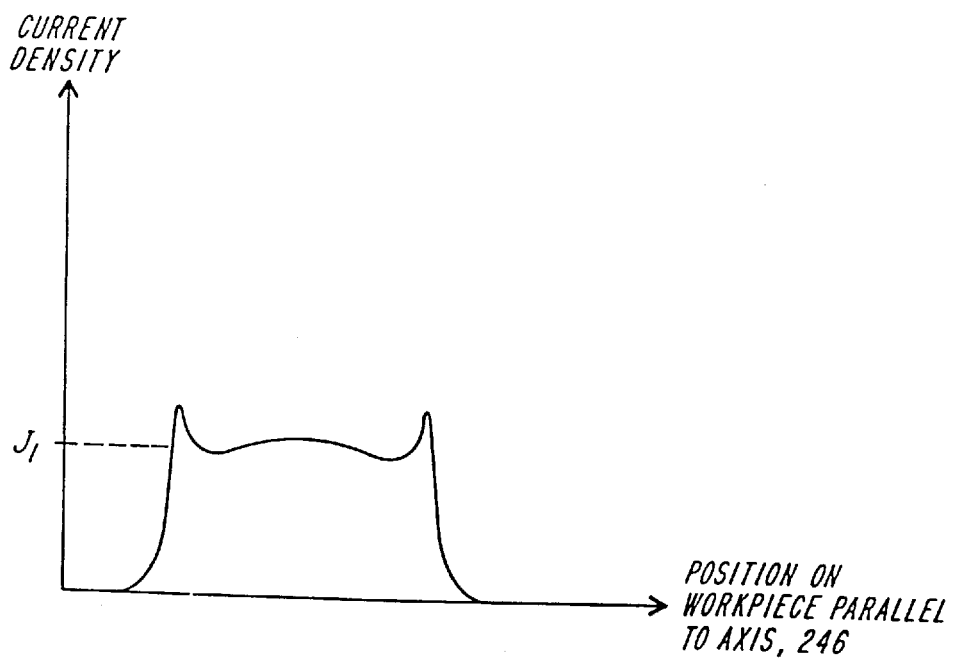

FIGS. 6A and 6B illustrate non-uniformities that can arise in current density at the workpiece 174 using an ion implantation system. In particular, FIG. 6A illustrates a representative graph of current density along a path parallel to axis 248 at the surface of the workpiece, and FIG. 6B illustrates a representative graph of current density along a path parallel to axis 246 at the surface of the workpiece. A representative non-uniformity is labeled as item number 69 in FIG. 6A. In a perfect ion implantation system, the current density at the workpiece constantly equals the nominal value $J_1$.

In ion implantation system 10, maintaining a near constant current density along a path parallel to axis 248 proves to be more critical than maintaining a near constant current density along a path parallel to axis 246. If the current density varies as shown in FIG. 6B, e.g. along axis 246, then various points on the workpiece along axis 174 at any point in time will receive a different ion dosage. However, as the workpiece progresses along axis 246, each point on the workpiece will pass through those areas in the ion beam having high current density and those areas having low current density. Accordingly, each point on the workpiece receives the same total dosage after completely passing through the ion beam. If the current density varies as shown in FIG. 6A, e.g. along axis 248, then various points on the workpiece along axis 248 at any point in time receive a different ion dosage, either high, low, or nominal. As the workpieces progresses along axis 246, each point continues to receive the same dosage, either high, low, or nominal. Accordingly, stripes of varying dosage that run substantially parallel to axis 246 form on the workpiece, each of the stripes corresponding to an area of high, low, or nominal dosage.

The invention provides systems for homogenizing the ion stream to remove these non-uniformities in current density, as discussed hereinafter. The systems for controlling uniformity of the ion beam can be applied to reduce or remove the non-uniformities as shown in FIGS. 6A or 6B. The homogenizing systems, however, are used primarily to remove the non-uniformities shown in FIG. 6A for the reasons discussed above.

Figure 7:
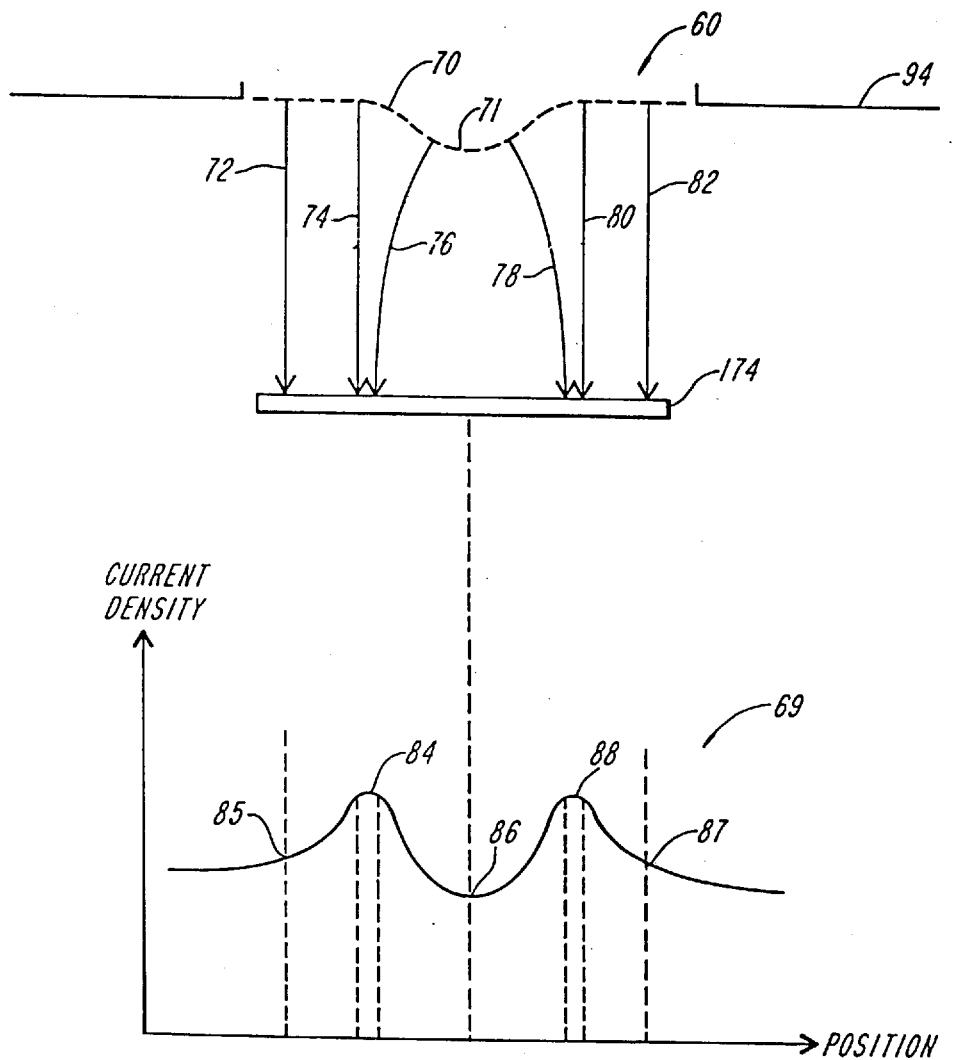
FIG. 7 is an exploded view of a non-uniformity illustrated in FIG. 6A.

FIG. 7 shows an exploded view of the representative non-uniformity 69 and schematically illustrates one possible cause of the non-uniformity 69. In particular, a plasma electrode 94 is positioned over the opening in an ion chamber (not shown). The plasma electrode has a slot 60 that causes the formation of a plasma meniscus 70. The meniscus has a convex bump 71 positioned in approximately the center of the meniscus. Illustrative ion paths 72, 74, 76, 78, 80, 82 are shown projecting from the plasma meniscus 70 towards the workpiece 174.

The bottom half of FIG. 7 shows a graph of current density versus position along the workpiece 174. On the graph the representative non-uniformity 69 is shown. In addition, the relationship between the non-uniformity 69 and the ion beam paths 72, 74, 76, 78, 80, and 82 is shown with dashed lines extending from the workpiece 174 to the graph. For instance, a relative minimum in current density 86 is associated with the convex hump 71 in the plasma meniscus 70. A first relative high in the current density 84 is associated with ion paths 74 and 74, and a second relative high in current density 88 is associated with ion paths 78 and 80. Nominal values in current density 85 and 87 are associated with ion paths 72 and 82, respectively.

FIG. 7 illustrates how a disturbance in the path of the ion beam can adversely affect the uniformity of the current density at the workpiece 174. For example, the hump 71 in the plasma meniscus 70 can cause a wiggle in the current density at the workpiece consisting of a valley 86 and two peaks 84, 88. It is understood that the ion stream exiting the ion source through the opening 60 in the aperture 94 is a highly collimated ion stream. As a result, changes in the path of a relatively small number of ions can dramatically effect the uniformity of the current density at the workpiece.

For instance, ion path 72, 74, 80 and 82 are all substantially parallel ion paths as they exit the opening 60 in aperture in electrode 94. These paths create a substantially uniform current density at the workpiece 174. In comparison, the hump 71 causes ion paths 76 and 78 to vary from the substantially parallel ion paths of the other ion beams. The ion beams 76 and 78, however, straighten out as they proceed towards the workpiece 174. As a result, ion beam 76 then overlaps with the path of ion beam 74, and ion beam 78 overlaps with the path of ion beam 80. The overlapping of paths creates the relative high in current density at peaks 84, 88 and the relative low in current density at valley 86. The variations in the paths of beam 76 and 78 caused by the plasma meniscus hump 71 results in a non uniform current density.

This example identifies how minor local variations in the plasma density can cause non-uniformities in the current density at the workpiece 174. Other minor defects in the ion implantation system can have similar effects on the current density. For instance, contaminant or particle build-up on electrodes both creates minor variations in the electric field generated by these electrodes and causes minor mechanical protrusions into the ion stream from the electrodes. These slight disturbances, however, can be sufficient to create non-uniformities similar to that illustrated in FIG. 7.

Non-uniformities in current density of the type described above can prove problematic in the treatment of a workpiece 174. In particular, variations in the current density along axis 248 can create stripes of varying dosage in the workpiece 174. A relative high in current density along axis 248 will produce a high dosage stripe in the workpiece 174 along axis 246. A relative low in current density along axis 248 produces a low dosage stripe in the workpiece along axis 246.

Figure 8:
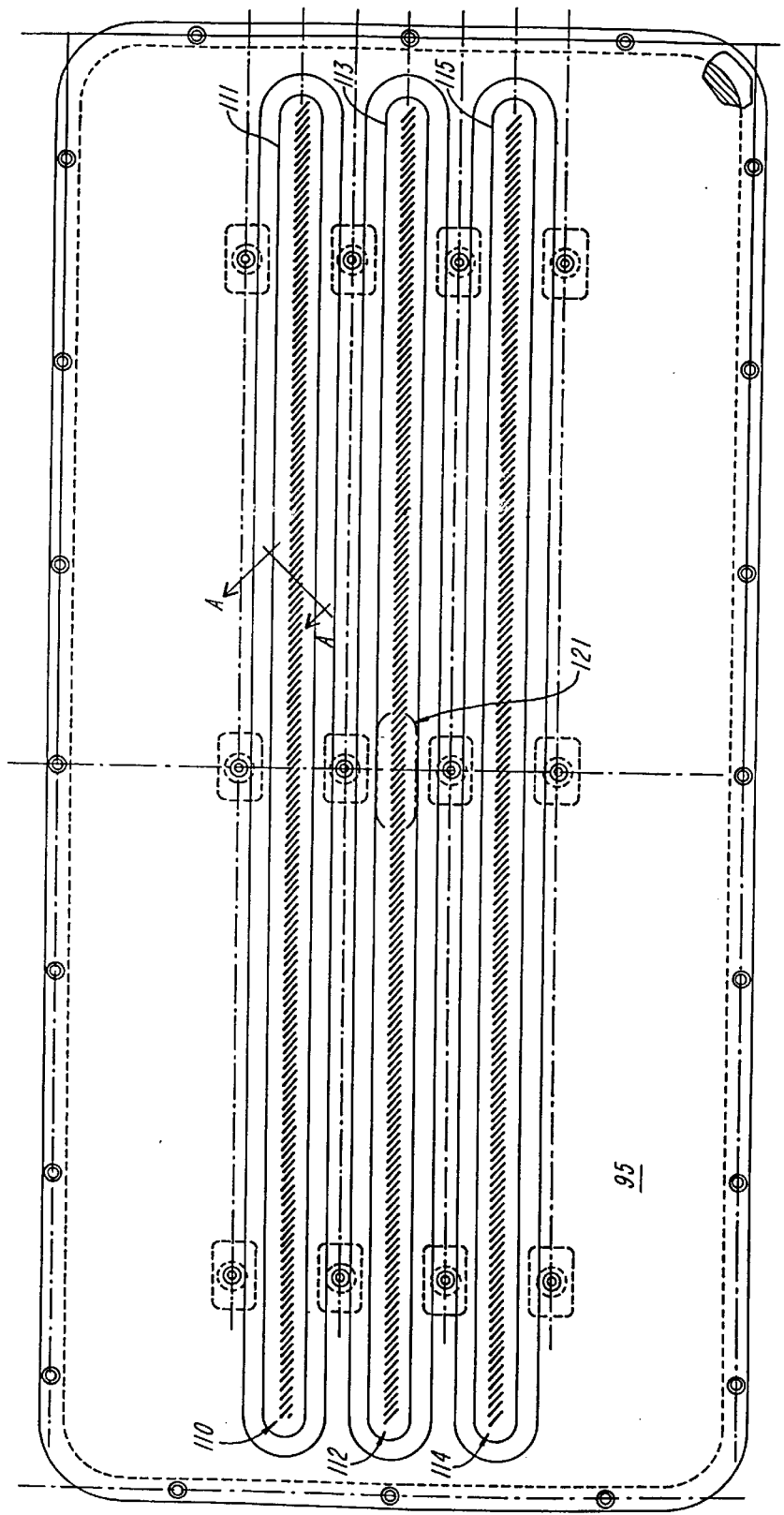
FIG. 8 shows the plasma electrode of FIG. 5 having three slots.

FIG. 8 illustrates a plasma electrode 95 having a diffusing system for reducing the non-uniformities in the ion stream. The inventors discovered a number of exemplary diffusing systems that reduce non-uniformities in current density introduced by the disturbances such as those discussed above in FIG. 7. Each of the diffusing systems improves the uniformity of current density along at least one axis of the workpiece by homogenizing the ion stream. Preferably, the diffusing systems enable the ion implantation system to obtain a current density that varies by less than 0.5% along at least one axis of the workpiece.

FIG. 8 illustrates an apertured plate 95 that can be used as a diffusing element for homogenizing the ion stream. The apertured plate 95 can be situated in the stream of ions anywhere between the ion source 18 and the workpiece 174. Preferably, the apertured plate is mounted within the opening 60 of the ion chamber 82. For instance, the apertured plate 95 can be shaped and adapted for engaging the opening 60 of the ion chamber 82, similar to technique whereby the plasma electrode 94 is adapted for engaging the opening 60 in the ion chamber 82.

The apertured plate 95 has a first array of openings 110, a second array of openings 112, and a third array of openings 114. The array of openings 110, 112, and 114 all extend along an axis substantially parallel to axis 124. Other aspects of the invention can provide for an apertured plate 95 having only a single array of openings extending along axis 124, such as array 110. The aperture plate 95 is placed in the ion stream such that the ion stream passes through the openings in the apertured plate, thereby homogenizing the ion stream to provide for a substantially uniform current density along at least one axis.

In the preferred embodiment where the apertured plate is mounted to the opening 60 of the ion chamber 82, the apertured plate 95 acts as a plasma electrode. The apertured plate provides a first elongated slot 111, a second elongated slot 113, and a third elongated slot 115. Slot 111 includes the first array of openings 110, slot 113 includes the second array of openings 112, and slot 115 includes the third array of openings 114. A representative group of openings is identified as item number 121. Each of the slots 111, 113, 115 separately allows a stream of ions to pass through to form a separate ribbon beam. Each of the ribbon beams produced by slots 111, 113, 115 overlap at the surface of the workpiece 174 to form a cumulative ribbon beam. In addition, due to the array of openings in each of the slots, each of the ribbon beams produced has a substantially uniform current density along at least one axis.

Further in accordance with this aspect of the invention, the electrode assembly 91 of FIG. 3 includes electrodes 96, 98, and 100 that differ from the plasma electrode 95. In particular, the disclosed plasma electrode includes one or more slots, each having an array of openings, while the electrodes 96, 98, and 100 do not include arrays of openings. Rather, the electrodes 96, 98, and 100 are formed as elongated slots without an apertured plate. The electrodes 96, 98, and 100 are simply formed of elongated slots having a high aspect ratio.

Figure 9:
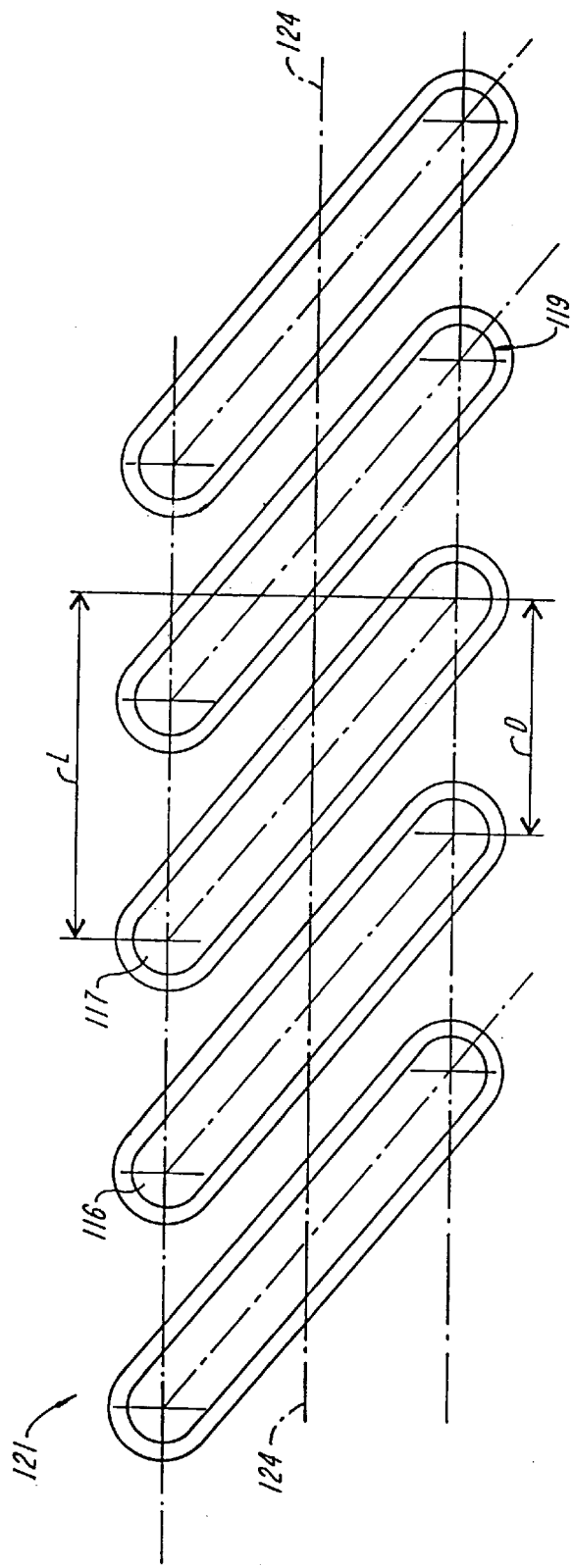
FIG. 9 is an exploded view of representative openings in the plasma electrode of FIG. 8.

FIG. 9 shows an exploded view of the representative group of openings 121 in FIG. 8. The group of openings includes a first opening 116, a second opening 117, and a third opening 119. The openings 116, 117, and 119 form an array that extends along the axis 124. Each of the openings in the array are in the shape of an ellipse. In addition, each of the elliptically shaped openings are oriented substantially parallel to the other openings in the array. The openings 121 prove particularly helpful in homogenizing the current density the ion beam along an axis substantially parallel to the axis 124 at the surface of the workpiece. This diffusing system achieves a current density that varies by less than 0.5% along axis 124 at the surface of the workpiece.

In accordance with one aspect of the invention, the array of oval or elliptical openings extending along axis 124 are governed by a particular mathematical expression such that the array reduces non-uniformities in the ion beam. Those openings that conform to the following mathematical expression reduce non-uniformities because the beamlets produced by each of the openings overlap at the surface of the workpiece. In particular, the openings are governed by the equation:

$$D=kL \qquad \text{(Equation A)}$$

where "k" is a constant in the range of ½ to ¾.

FIG. 9 shows the graphical representations for "D" and "L" in Equation A, relative to the array of openings. In particular, "D" is the distance between the foci of adjacent elliptically shaped openings in the array 112; and "L" is the length of each elliptically shaped opening along the axis of elongation of array 112. That is, "L" equals the distance of the opening 117 along axis 124 of the array 112.

Figure 10:
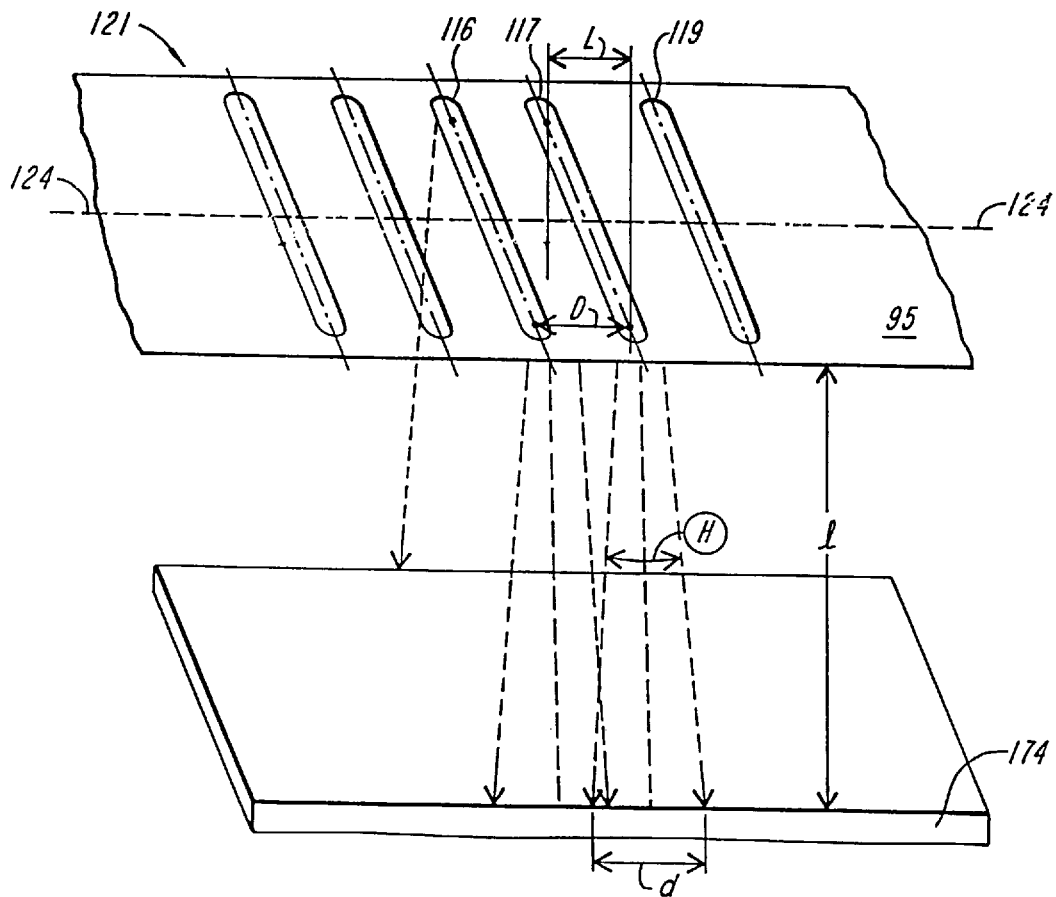
FIG. 10 is an exploded view in perspective of representative openings in the plasma electrode of FIG. 8.

FIG. 10 shows an exploded view in perspective of the representative group of openings 121 in FIGS. 8 and 9. The openings 121 are located on the apertured plate 95. The representative openings 121 in the apertured plate 95 form an array that extends along axis 124, and the array shown includes the opening 116, the opening 117, and the opening 119.

FIG. 10 also illustrates, in perspective, the workpiece 174 positioned below the apertured plate 95 and separated from the plasma electrode by a distance "I". The ion beam projecting through opening 117 has an angular width "θ", and the ion beam projecting through opening 117 forms a beam having a width "d" at the surface of the workpiece 174.

The inventors have also discovered that an apertured plate having a multiple number of slots, such as slot 111, 113, and 115 of FIG. 8, can have varying degrees of uniformity depending upon the geometry of the slots in the apertured plate. Particularly, an apertured plate having openings that abide by the following equation will produce a ribbon beam having an improved level of uniformity at the surface of the workpiece 174. Those openings that conform to the following mathematical expression reduce non-uniformities because the beamlets produced by each of the openings overlap at the surface of the workpiece.

$$L < gNl\theta \quad \text{(Equation B)}$$

With reference to Equation B, "L" is the distance between the openings along axis 124, "g" is a constant in the range of 0 to 1, "l" is the distance between the apertured plate 95 and the workpiece 174, and "N" is the number of slots in the aperture. For instance, the number of slots "N" shown in FIG. 8 in aperture 95 is three. With further reference to Equation B, "θ" is the angular width of the beamlet exiting an opening, and can be approximated as "d" divided by "l". Typically the angular width of the beamlet is measured along the direction of axis 124. Equation B, in comparison to Equation A, is more generic. Equation B applies to all openings, regardless of shape, while Equation A is more suited for those instance where elliptical or oval openings are utilized.

Figure 11:
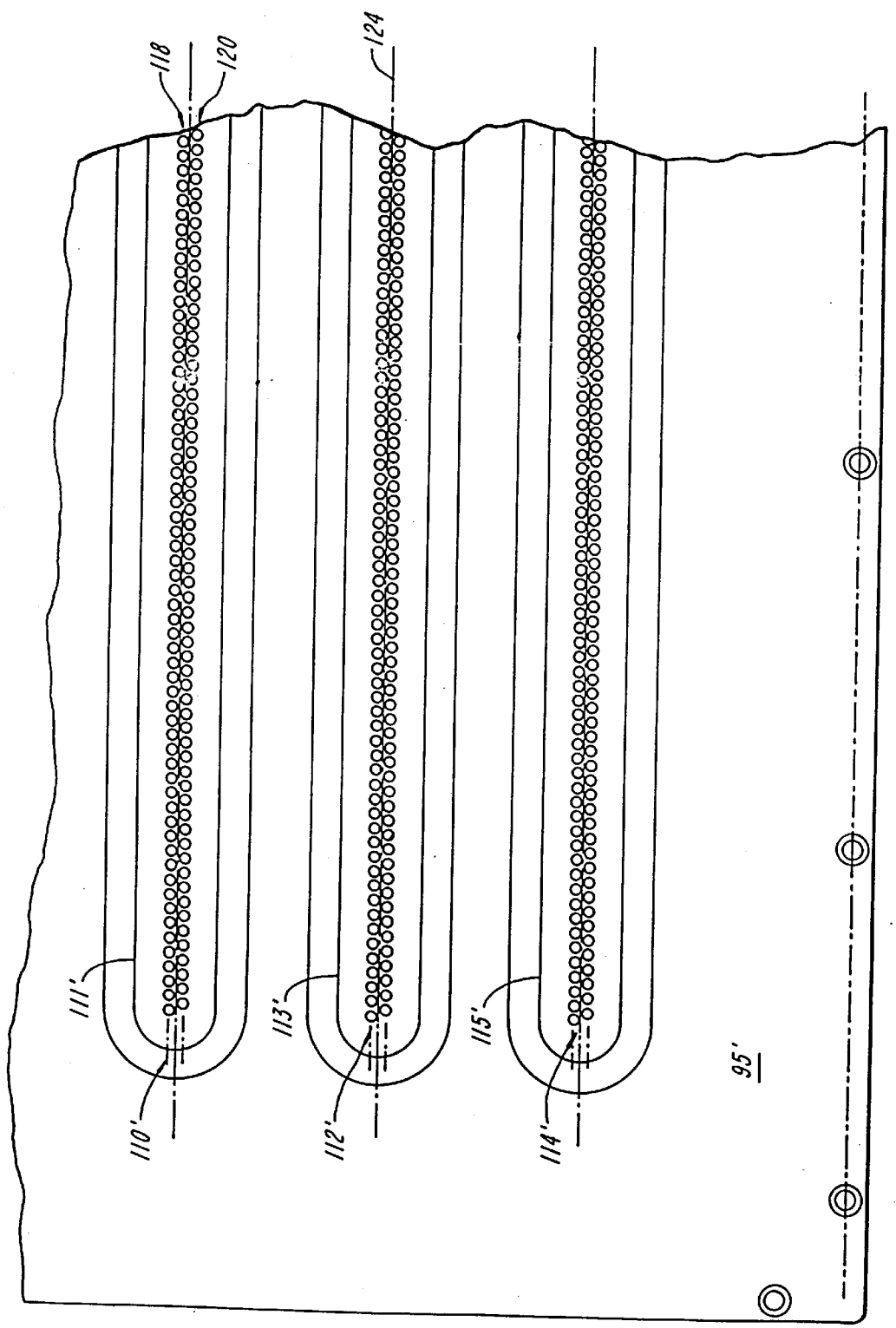
FIG. 11 is an alternative embodiment of the plasma electrode of FIG. 8.

FIG. 11 illustrates an apertured plate 95' having a first slot 111' a second slot 113' and a third slot 115'. The first slot 111' has a first array of openings 110', the second slot 113 has an array of openings 112', and the third slot 115' has an array of openings 114'. Each array of openings 110', 112', 114', extends along an axis substantially parallel to axis 124. The apertured plate 95' acts as a diffusing element for homogenizing an ion stream when placed in the path of the ion stream. When the aperture plate is positioned in the ion stream, the ion stream passes through the openings in the apertured plate such that the ion stream is homogenized and forms an ion beam having substantially uniform current density along at least one axis. In the preferred embodiment the apertured plate 95' is mounted to the opening 60 of the ion chamber 82, and the apertured plate 95 acts as a plasma electrode.

Each of the slots 111', 113', and 115', separately produce an elongated ribbon beam when placed in the path of the ion stream. Each of the ribbon beams overlap and form a cumulative ribbon beam at the surface of the workpiece 174. In addition, due to the array of openings in each of the slots, each of the ribbon beams produced has a substantially uniform current density along at least one axis.

FIG. 11 also shows that the array of openings 110', 112', 114' are formed of a first row 118 of circular openings and a second row 120 of circular openings. Both rows 118 and 120 extend along a path substantially parallel to axis 124. In addition, each individual opening in row 120 is oriented to the right and below an individual opening in row 118. This orientation of the individual openings in rows 118 and 120 creates an overall structure having an array of staggered openings that extends along a path substantially parallel to axis 124.

Figure 12:
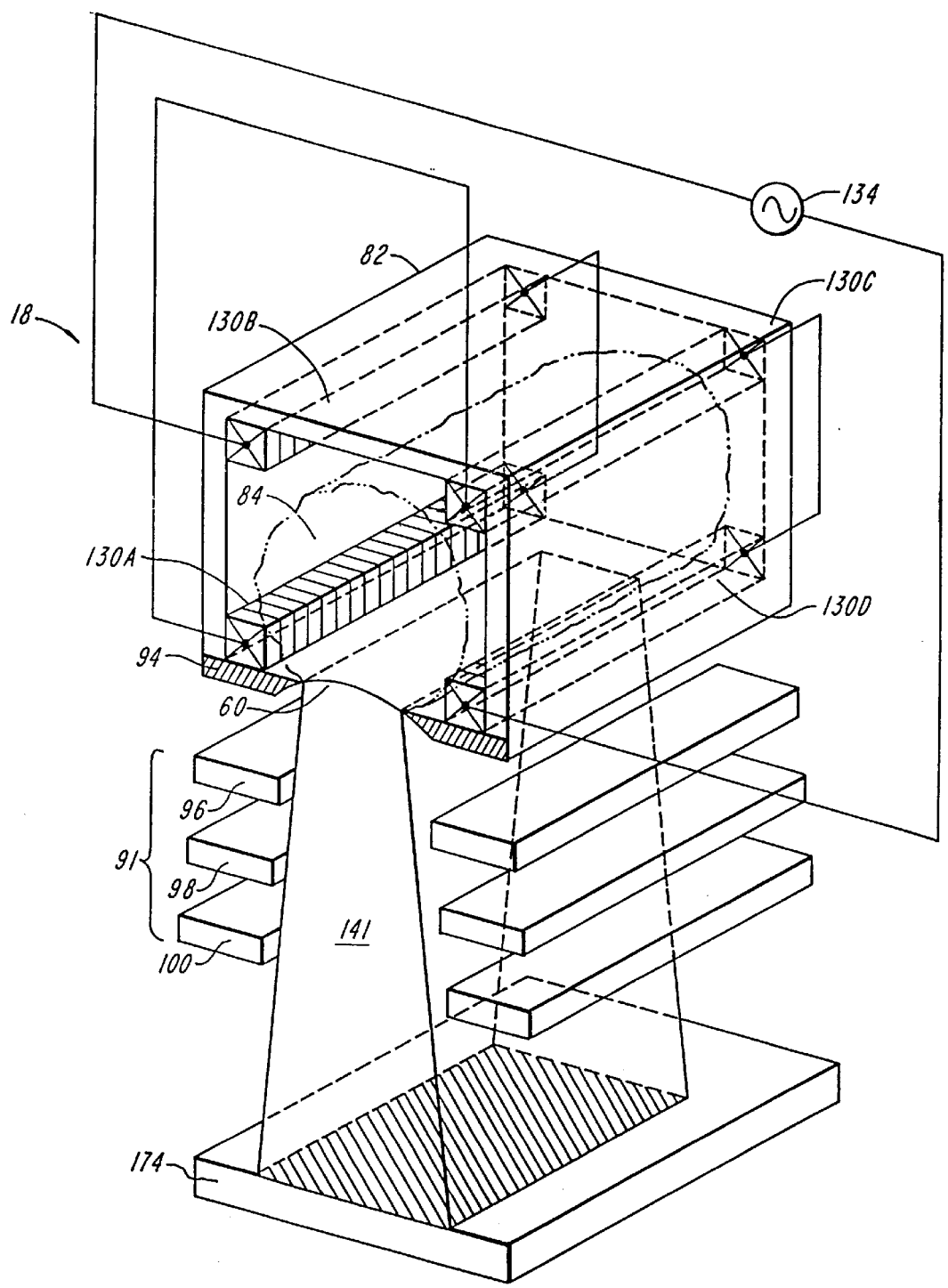
FIG. 12 is a schematic illustration of the ion source of FIG. 1 having a dithering magnet.

FIG. 12 illustrates another embodiment of the diffusing element for homogenizing the ion stream. In particular, FIG. 12 shows a dithering magnet system that homogenizes the ion stream to produce a ribbon beam having a substantially uniform current density. The ion chamber 82 contains a plasma 84. The ion chamber 82 also includes the opening 60 through which the ion stream exits and forms the ion beam 141. A plasma electrode 94 is situated over the opening 60 to aid in controlling the ions exiting the ion chamber 82. The electrode assembly 91 has an extraction electrode 96, a suppression electrode 98 and a ground electrode 100. The electrode assembly directs the ion beam 141 towards the workpiece 174.

FIG. 12 also illustrates a first dithering magnet 130A, a second dithering magnet 130B, a third dithering magnet 130C, and a fourth dithering magnet 130D mounted to the ion chamber 82. The dithering magnets are typically formed of coils wrapped around a metallic core, thus forming an electromagnet having a first end and a second end. The dithering magnets are electrically coupled to an alternating current source 134 in the manner shown in FIG. 12. In particular, the output of the current source is connected to the first end of magnet 130B, and the second end of magnet 130B is connected to the second end of magnet 130A. The first end of magnet 130A is connected to the first end of magnet 130C, and the second end of magnet 130C is connected to the second end of magnet 130D. The first end of magnet 130D is connected the return of the current source 134.

The current source 134 is variable and causes the dithering magnets 130A, 130B, 130C, and 130D to oscillate. The oscillation of dithering magnets 130 and 132 creates an oscillating magnetic field in the plasma 84. The oscillating magnetic field in the plasma causes homogenization of the ions in the ion stream 141. This homogenization lessens the susceptibility of the ion stream to disturbances capable of forming non-uniformities in the current density at the workpiece 174.

Figure 13:
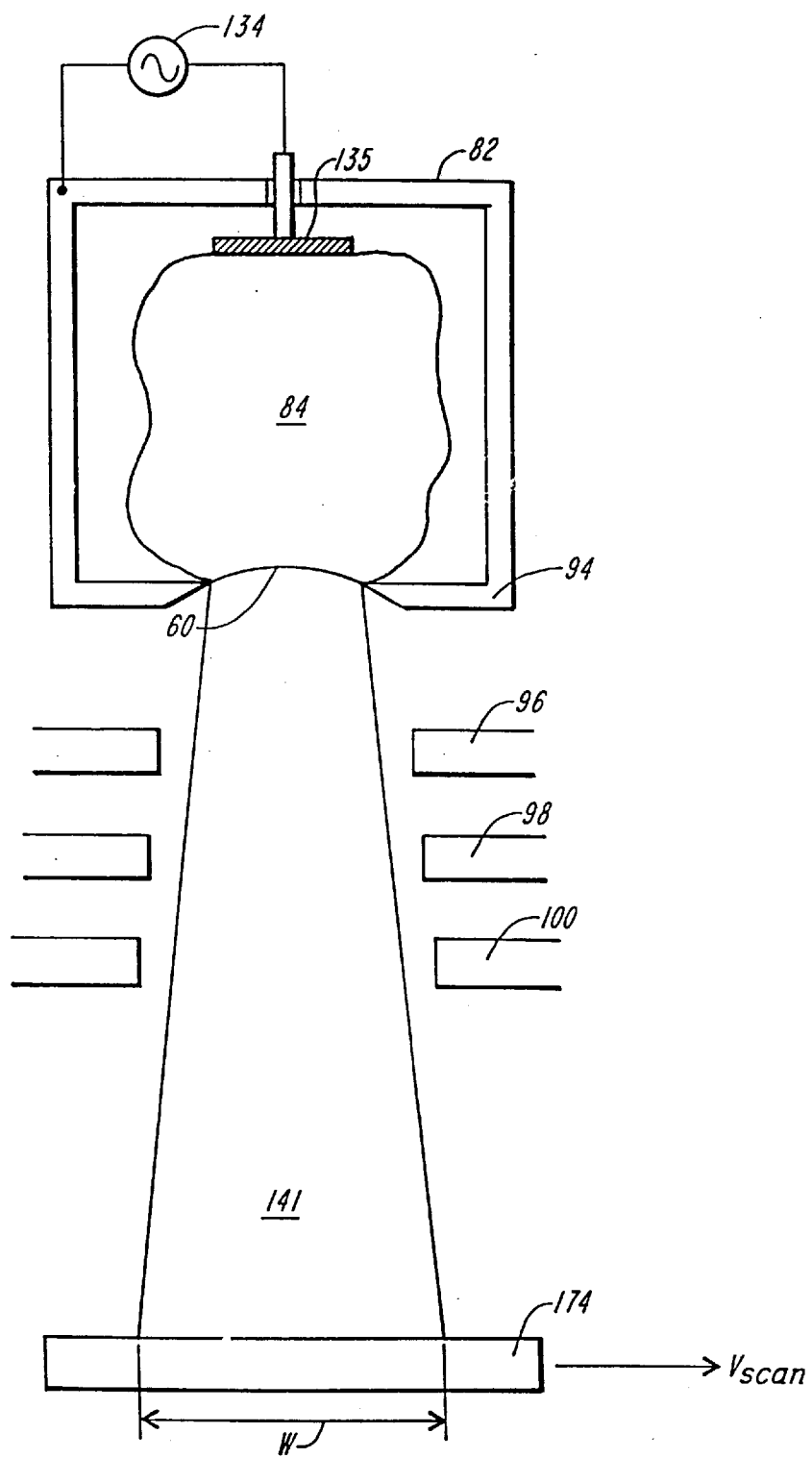
FIG. 13 is a schematic illustration of the ion source of FIG. 1 having a diffusing electrode.

FIG. 13 illustrates another embodiment of the diffusing element for homogenizing the ion stream. In particular, FIG. 13 shows a dithering electrode system that homogenizes the ion stream to produce a ribbon beam having a substantially uniform current density. The ion chamber 82 contains a plasma 84. The ion chamber 82 also includes the opening 60 through which the ion stream exits and forms the ion beam 141. A plasma electrode 94 is situated over the opening 60 to aid in controlling the ions exiting the ion chamber 82. The electrode assembly 91 has an extraction electrode 96, a suppression electrode 98 and a ground electrode 100. The electrode assembly directs the ion beam 141 towards the workpiece 174.

The dithering electrode system includes an alternating current source 134 connected to a dithering electrode 135. The dithering electrode is mounted to the ion source 82. Typically the dithering electrode 135 is situated proximal to the plasma 84. The dithering electrode coupled in conjunction with the alternating current source 134 forms an oscillating electric field proximal to the plasma 84. The oscillating electric field causes homogenization of the ions in the ion stream 141. This homogenization lessens the susceptibility of the ion stream to disturbances capable of forming non-uniformities in the current density at the workpiece 174.

Preferably, the frequency of oscillation of the dithering electrode is governed by the following expression:

$$F > \frac{n * V_{scan}}{w} \quad \text{(Equation C)}$$

With further reference to Equation C, "F" is the frequency of the oscillating electric field generated by the dithering electrode, "n" is a constant in the range of 10 to 100; "$V_{scan}$" is the speed of movement of a workpiece through the ribbon beam 141, and "W" is the width of the ribbon beam at the workpiece.

Figure 14:
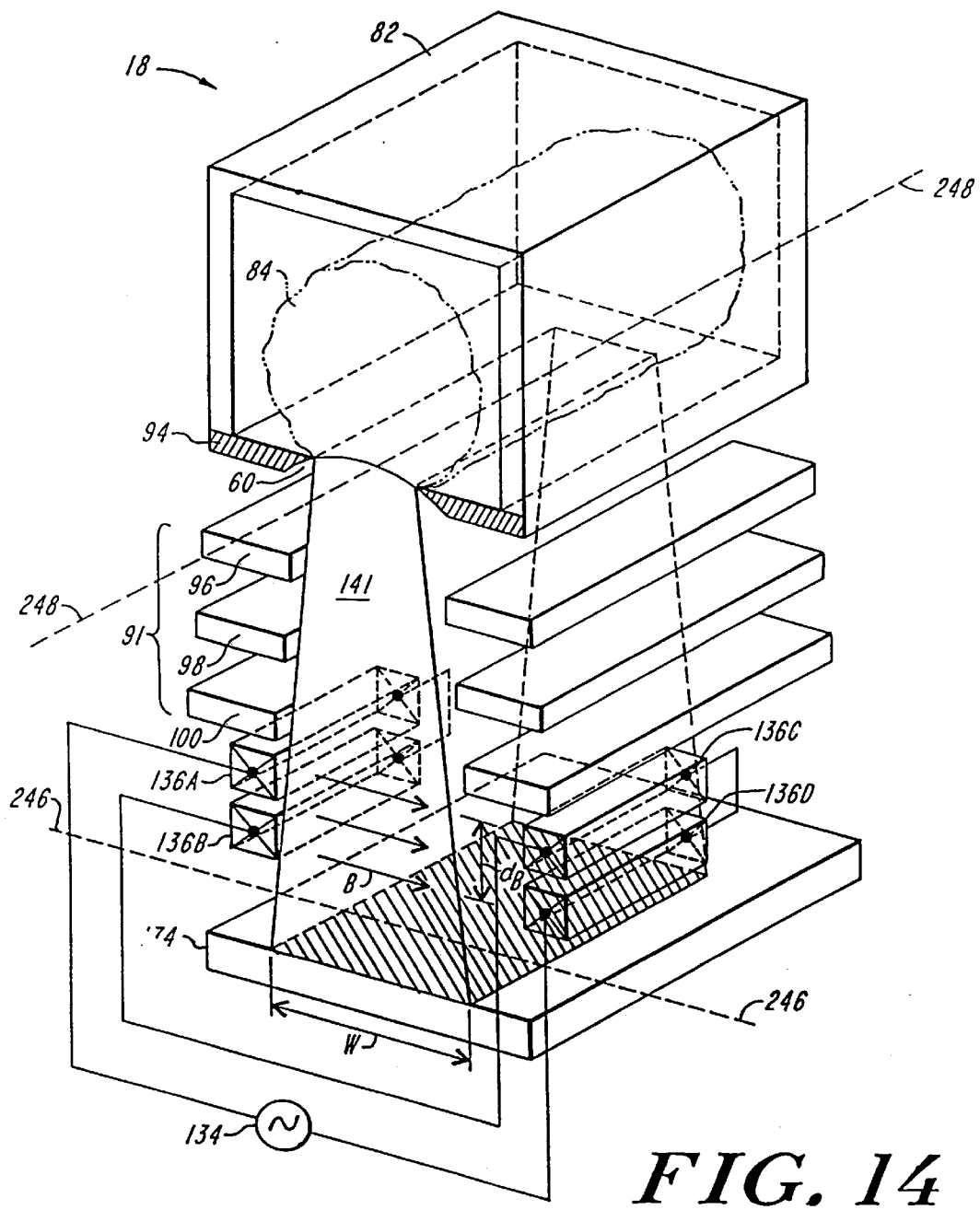
FIG. 14 is a schematic illustration of the ion source of FIG. 1 having a diffusing magnet.

FIG. 14 illustrates another embodiment of the diffusing element for homogenizing the ion stream. In particular, FIG. 14 shows a diffusing magnet system that homogenizes the ion stream to produce a ribbon beam having a substantially uniform current density. The ion chamber 82 contains a plasma 84. The ion chamber 82 also includes the opening 60 through which the ion stream exits and forms the ion beam 141. A plasma electrode 94 is situated over the opening 60 to aid in controlling the ions exiting the ion chamber 82. The electrode assembly 91 has an extraction electrode 96, a suppression electrode 98 and a ground electrode 100. The electrode assembly directs the ion beam 141 towards the workpiece 174.

The diffusing magnet system includes a first diffusing magnet 136A, a second diffusing magnet 136B, a third diffusing magnet 136C, and a fourth diffusing magnet 136D. The diffusing magnets are typically formed of coils wrapped around a metallic core, thus forming an electromagnet having a first end and a second end. The diffusing magnets are electrically coupled to alternating current source 134 in the manner shown in FIG. 12. In particular, the output of the current source is connected to the first end of magnet 136A, and the second end of magnet 136A is connected to the second end of magnet 136B. The first end of magnet 136B is connected to the first end of magnet 136C, and the second end of magnet 136C is connected to the second end of magnet 136D. The first end of magnet 136D is connected the return of the current source 134.

The alternating current source 134 is variable and causes the diffusing magnets 136A, 136B, 136C, and 136D to oscillate. The diffusing magnet 136 in conjunction with the variable current source forms an oscillating magnetic field proximal to the stream of ions forming the ion beam. The oscillating magnetic field causes homogenization of the ions in the ion stream 141. This homogenization lessens the susceptibility of the ion stream to disturbances capable of forming non-uniformities in the current density at the workpiece 174.

Preferably, the frequency of oscillation of the diffusing magnets is governed by the following expression:

$$F > \frac{n^* V_{scan}}{w}. \quad \text{(Equation D)}$$

With further reference to Equation D, "F" is the frequency of the oscillating magnetic field generated by the diffusing magnets, "n" is a constant in the range of 10 to 100; "$V_{scan}$" is the speed of movement of a workpiece through the ribbon beam 141, and "W" is the width of the ribbon beam at the workpiece.

The B-field, designated by the letter "B" and three parallel arrows is illustrated in FIG. 14. The B-field has a height "$d_B$", as also shown in FIG. 14. Preferably, the B-field generated by the diffusing magnets decreases uniformities in the ribbon beam along the length of the ribbon beam. For instance, the B-field reduces non-uniformities in current density along a path substantially parallel to axis 248 at the surface of the workpiece.

Further in accordance with this preferred embodiment of the diffusing magnet system, the B-field is directed through the ion beam 141 along a path substantially parallel to axis 246. A B-field directed along this path causes the ions in the ion beam 141 to dither along the direction of axis 248. This dithering increases the uniformity of the ion beam along the length of the ribbon beam, i.e. axis 248.

The strength of the B-field required to homogenize the ion beam varies as a function of the extraction voltage applied to extraction electrode 96, the ion mass, and the angular width θ of the ion beam 141, as shown in FIG. 10. Accordingly, the strength of the B-field is in the range of 500–3000 Gauss-centimeter per $d_B$, and is preferably 2800 Gauss-centimeter per $d_B$.

It will thus be seen that the invention efficiently attains the objects set forth above, among those made apparent from the preceding description. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall there between.

Having described the invention, what is claimed as new and desired to be secured by Letters Patent is:

1. A ribbon beam generating ion implantation apparatus for treating a workpiece, the apparatus comprising:
    an ion chamber for containing a plasma formed of ionized matter, the chamber having an opening,
    a plasma electrode adapted for engaging the opening in the chamber and for shaping a stream of ions exiting the chamber, the plasma electrode having an elongated slot,
    a diffuser that homogenizes the path of the stream of ions exiting the chamber such that a diffused ion stream is formed, the diffused ion stream having a substantially uniform current density along at least one axis, and
    an electrode assembly for directing the diffused ion stream to treat the workpiece,
    wherein the diffused ion stream treating the workpiece is in the shape of a ribbon beam.

2. An apparatus according to claim 1, wherein the diffuser includes an apertured plate placed in the path of the stream of ions, the plate having an array of openings.

3. An apparatus according to claim 2, wherein the apertured plate is the plasma electrode.

4. An apparatus according to claim 3 wherein the apertured plate is in accordance with the expression L<glΘ, where L=the length of each opening along the axis,
    g=a constant in the range of 0 to 1,
    l=the distance between the apertured plate and the workpiece, and
    Θ=the angular width of the stream of ions exiting at least one opening in the apertured plate.

5. An apparatus according to claim 4 wherein the apertured plate includes at least one additional array of openings in the path of the stream of ions, the apertured plate being in accordance with the expression L<gNlΘ, where N=the number of arrays of openings in the apertured plate.

6. An apparatus according to claim 2, wherein the array of openings extends along an axis substantially parallel to the elongated slot such that the stream of ions is diffused along a direction substantially parallel to the elongated slot.

7. An apparatus according to claim 6, wherein the array of openings includes a plurality of circularly shaped openings oriented in a plurality of staggered rows.

8. An apparatus according to claim 1, wherein the diffuser includes a diffusing magnet located proximal to the path of the stream of ions, the diffusing magnet being capable of generating an oscillating magnetic field.

9. An apparatus according to claim 8, wherein the oscillating magnetic field has a frequency F, such that $$F > \frac{n^* V_{scan}}{w},$$

where n is a constant in the range of 10 to 100,
    $V_{scan}$ is a speed of movement of the workpiece through the ribbon beam, and
    w is the width of the ribbon beam at the workpiece.

10. An apparatus according to claim 8, wherein the oscillating magnetic field has a strength in the range of 500–3000 gauss.

11. An apparatus according to claim 1, wherein the diffuser includes a dithering electrode electrically coupled with the ion chamber such that the dithering electrode causes the plasma to oscillate.

12. An apparatus according to claim 11, wherein the dithering electrode forms an oscillating electric field having a frequency F, such that $$F > \frac{n * V_{scan}}{w},$$

where n is a constant in the range of 10 to 100, $V_{scan}$ is a speed of movement of the workpiece through the ribbon beam, and w is the width of the ribbon beam at the workpiece.

13. An apparatus according to claim 1, wherein the diffuser includes a dithering magnet magnetically coupled with the ion chamber such that the dithering magnet causes the plasma to oscillate.

14. An apparatus according to claim 1, wherein the diffuser homogenizes the stream of ions such that the ribbon beam has a current density that varies by less than 0.5% along the elongated axis of the ribbon beam.

15. An apparatus according to claim 1, wherein the slot has a length in the range of 10 centimeters to 2 meters and has a width in the range of 1 millimeter to 20 millimeters.

16. An apparatus according to claim 1, wherein the plasma electrode includes at least one additional slot oriented substantially parallel to the elongated slot, the at least one additional slot forming a secondary beam that overlaps the diffused ion stream to produce a cumulative ribbon beam.

17. An apparatus according to claim 16, wherein the cumulative ribbon beam has a length that varies from 25 centimeters to 1000 centimeters at the surface of the workpiece and has a width that varies from 1 millimeter to 250 millimeters at the surface of the workpiece.

18. An apparatus according to claim 1, wherein the elongated slot is oriented transverse to the scanning direction of the workpiece and wherein the length of the diffused ion stream exceeds the width of the workpiece, such that the total area of the workpiece is treated during one scan of the workpiece through the diffused ion stream.

19. An apparatus according to claim 16, wherein the width of the cumulative ribbon beam varies between 10–30 centimeters at the surface of the workpiece.

20. An apparatus according to claim 16, wherein the angles of the ion streams forming the cumulative ribbon beam diverge by 5–15 degrees after exiting the plasma electrode.

21. An apparatus according to claim 16, wherein the current density of the cumulative beam is in the range of 0.02 to 100 micro amps per square centimeter.

22. An apparatus according to claim 16, wherein the energy of the ions in the cumulative beam is in the range of 1 to 100 kiloelectron volts.

23. An apparatus according to claim 16, wherein the slot and the at least one additional slot each have an aspect ratio exceeding 100:1.

24. An apparatus according to claim 16, wherein the diffuser comprises an apertured plate having an array of openings, the apertured plate being mounted to the elongated slot of the plasma electrode such that the distance between the elongated slot and the additional slot is greater than the distance between any pair of openings in the apertured plate.

25. An apparatus according to claim 3, wherein the electrode assembly includes an additional electrode positioned downstream of the plasma electrode, the additional electrode having an elongated slot for passing the stream of ions.

26. An apparatus according to claim 25, wherein the additional electrode has an aspect ratio less than 50:1.

27. A ribbon beam generating ion implantation apparatus for treating a workpiece, the apparatus comprising:

an ion chamber for containing a plasma formed of ionized matter, the chamber having an opening, a plasma electrode mounted to the opening in the chamber, the plasma electrode having an elongated slot such that the stream of ions exiting the chamber forms a ribbon beam, diffusing means for homogenizing the path of the stream of ions forming the ribbon beam such that a diffused ion stream is formed, the diffused ion stream having a substantially uniform current density along at least one axis, and an electrode assembly for directing the diffused ion stream to treat the workpiece.

28. An apparatus according to claim 27, wherein the diffusing means includes an apertured plate placed in the path of the stream of ions, the plate having an array of openings.

29. An apparatus according to claim 28, wherein the apertured plate is the plasma electrode.

30. An apparatus according to claim 29 wherein the apertured plate is in accordance with the expression L<glΘ, where L=the length of each opening along the axis, g a constant in the range of 0 to 1, l=the distance between the apertured plate and the workpiece, and Θ=the angular width of the stream of ions exiting at least one opening in the apertured plate.

31. An apparatus according to claim 30 wherein the apertured plate includes at least one additional array of openings in the path of the stream of ions, the apertured plate being in accordance with the expression L<gNlΘ, where N=the number of arrays of openings in the apertured plate.

32. An apparatus according to claim 28, wherein the array of openings extends along an axis substantially parallel to the elongated slot such that the stream of ions is diffused along a direction substantially parallel to the elongated slot.

33. An apparatus according to claim 32, wherein the array of openings includes a plurality of elliptically shaped openings, each opening being oriented substantially parallel to the other openings.

34. An apparatus according to claim 33, wherein the foci of adjacent elliptically shaped openings are separated by a distance D, in accord with the expression D=kL, where L is the length of each elliptically shaped opening along the axis and where k is a constant in the range of ½ to ¾.

35. An apparatus according to claim 32, wherein the array of openings includes a plurality of circularly shaped openings oriented in a plurality of staggered rows.

36. An apparatus according to claim 27, wherein the diffusing means includes a diffusing magnet located proximal to the path of the stream of ions forming the ribbon beam, the diffusing magnet being capable of generating a variable magnetic field.

37. An apparatus according to claim 27, wherein the diffusing means includes a dithering electrode electrically coupled with the ion chamber such that the dithering electrode causes the plasma to oscillate.

38. An apparatus according to claim 27, wherein the diffusing means includes a dithering magnet magnetically coupled with the ion chamber such that the dithering magnet causes the plasma to oscillate.

39. An apparatus according to claim 29, wherein the electrode assembly includes an additional electrode positioned downstream of the plasma electrode, the additional electrode having an elongated slot for passing the stream of ions.

40. An apparatus according to claim 39, wherein the additional electrode has an aspect ratio less than 50:1.

41. A ribbon beam generating ion implantation apparatus for treating a workpiece, the apparatus comprising:

an ion chamber for containing a plasma formed of ionized matter, the chamber having an opening, a plasma electrode mounted to the opening in the chamber, the plasma electrode having a plurality of elongated substantially parallel slots, each of the plurality of slots forming a stream of ions in the form of a ribbon beam, a diffuser placed in the path of the ribbon beams the diffuser including an apertured plate that homogenizes the path of the ribbon beams such that a plurality of diffused ion streams are formed, and an electrode assembly for directing the plurality of plurality of diffused ions streams to treat the workpiece such that the plurality of diffused ion streams overlap at the surface of the workpiece and form a cumulative ribbon beam having a substantially uniform current density along an axis substantially parallel to the elongated slots.

42. An apparatus according to claim 41, wherein the apertured plate has an array of openings and the distance between any pair of elongated slots in the plasma electrode is greater than the distance between any pair of openings in the apertured plate.

43. An apparatus according to claim 41, wherein the electrode assembly includes an additional electrode positioned downstream of the plasma electrode, the additional electrode having an elongated slot for passing the diffused ion stream.

44. A ribbon beam generating ion implantation apparatus for treating a workpiece, the apparatus comprising:

an ion chamber for containing a plasma formed of ionized matter, the chamber having an opening, a plasma electrode adapted for engaging the opening in the chamber and for shaping a stream of ions exiting the chamber, the plasma electrode having an elongated slot, a diffusing element that homogenizes the stream of ions to provide a ribbon beam having a substantially uniform current density along at least one axis, the diffusing element including an apertured plate placed in the path of the stream of ions, the apertured plate having an array of elliptically shaped openings that extend along an axis substantially parallel to the elongated slot, each opening being oriented substantially parallel to the other openings, and an electrode assembly for directing the stream of ions toward the workpiece, wherein the ion stream treating the workpiece is in the shape of a ribbon beam.

45. An apparatus according to claim 44, wherein the foci of adjacent elliptically shaped openings are separated by a distance D, in accord with the expression D=kL, where L is the length of each elliptically shaped opening along the axis and where k is a constant in the range of ½ to ¾.

46. A plasma electrode for use in a ribbon beam generating ion implantation apparatus for treating a workpiece, the apparatus having an ion chamber for containing a plasma formed of ionized matter, the chamber having an opening through which ions can exit, and an electrode assembly for directing a stream of ions toward the workpiece, wherein the plasma electrode comprises an electrode characterized as being disposable at the opening of the chamber, the plasma electrode having an elongated slot for shaping a stream of ions into the shape of a ribbon beam exiting the chamber, and an apertured plate placed in the path of the stream of ions forming the ribbon beam, the plate having an array of elliptical openings for diffusing the stream of ions.

47. A method of treating a workpiece with an ion beam, comprising the steps of:

forming a plasma of ionized matter in an ion chamber having a plasma electrode, causing the plasma to exit the ion chamber as a stream of ions through an elongated opening in the plasma electrode, homogenizing the path of the stream of ions to form a diffused ion stream, the diffused ion stream having a substantially uniform current density along at least one axis, and directing the diffused ion stream to treat the workpiece, wherein the diffused ion stream is in the shape of a ribbon beam.

48. A method in accordance with claim 47, wherein the homogenizing step further comprises placing an apertured plate in the path of the stream of ions.

49. A method in accordance with claim 48, further comprising the step of mounting the apertured plate to the plasma electrode.

50. A method in accordance with claim 48, further comprising the step of diffusing the path of the ion stream along a direction substantially parallel to the elongated slot by providing an apertured plate having an array of openings that extends along an axis substantially parallel to the elongated slot.

51. A method in accordance with claim 48, wherein the homogenizing step further comprise placing an apertured plate having an array of elliptically shaped openings in the path of the stream of ions.

52. A method in accordance with claim 47, wherein the homogenizing step includes diffusing the stream of ions such that the diffused ion stream has a current density that varies by less than 0.5% along the elongated axis of the ribbon beam.

53. A method in accordance with claim 47, further comprising the step of providing an additional slot in the plasma electrode oriented substantially parallel to the elongated slot such that a second stream of ions is generated.

54. A method in accordance with claim 47, further comprising the step of orienting the elongated slot transverse to the scanning direction of the workpiece.

55. A method in accordance with claim 47, wherein the step of directing the diffused ion stream further comprises the step of directing the diffused ion stream through an additional electrode positioned downstream of the plasma electrode, the additional electrode having an elongated slot for passing the diffused ion stream.

* * * * *